United States Patent [19]

Normandin et al.

[11] Patent Number: 5,051,617
[45] Date of Patent: Sep. 24, 1991

[54] MULTILAYER SEMICONDUCTOR WAVEGUIDE DEVICE FOR SUM FREQUENCY GENERATION FROM CONTRA-PROPAGATING BEAMS

[75] Inventors: Richard J. F. Normandin; Francoise Chatenoud, both of Ottawa; Robin L. Williams, Orleans, all of Canada

[73] Assignee: National Research Council Canada, Ottawa, Canada

[21] Appl. No.: 545,497

[22] Filed: Jun. 29, 1990

[51] Int. Cl.[5] .............................................. H03F 7/00
[52] U.S. Cl. .................................... 359/328; 359/326; 372/21; 372/22; 385/49; 385/130
[58] Field of Search ....................... 372/21, 22, 43, 44, 372/45, 50, 7, 92, 96, 98, 102, 108; 350/96.11, 96.12, 96.13, 96.14, 96.15, 96.17; 307/424, 427, 430

[56] References Cited

U.S. PATENT DOCUMENTS

| | | | |
|---|---|---|---|
| 3,746,879 | 7/1973 | Esaki et al. | 307/427 |
| 3,982,135 | 9/1976 | van der Ziel | 307/427 |
| 4,382,660 | 5/1983 | Pratt, Jr. et al. | 370/10 |
| 4,743,083 | 5/1988 | Schimpe | 350/96.19 |
| 4,763,019 | 8/1988 | Duquay et al. | 307/427 |
| 4,896,195 | 1/1990 | Jansen et al. | 357/17 |
| 4,897,844 | 1/1990 | Schimpe | 372/26 |
| 4,904,038 | 2/1990 | Charge | 350/96.14 |
| 4,904,045 | 2/1990 | Alferness et al. | 350/96.19 |
| 4,905,253 | 2/1990 | Chraplyvy et al. | 372/96 |
| 4,930,132 | 5/1990 | Shimizu et al. | 372/22 |
| 4,948,960 | 8/1990 | Simms et al. | 250/227.11 |

Primary Examiner—William L. Sikes
Assistant Examiner—Galen J. Hansen
Attorney, Agent, or Firm—Y. Toyooka

[57] ABSTRACT

Sum frequency generating devices are disclosed. The devices include a waveguide having a multilayer structure comprising at least one nonlinear semiconductor material. In a preferred embodiment, each of the layers of the multilayer structure has the same thickness and alternate layers have a first and a second predetermined refractive index. The sum frequency output generated by two contra-propagating beams of fundamental wavelengths within the waveguide is enhanced by the multilayer structure of the waveguide. The sum frequency output is in a direction different from that of the waveguide and contrapropagating fundamental beams.

20 Claims, 6 Drawing Sheets

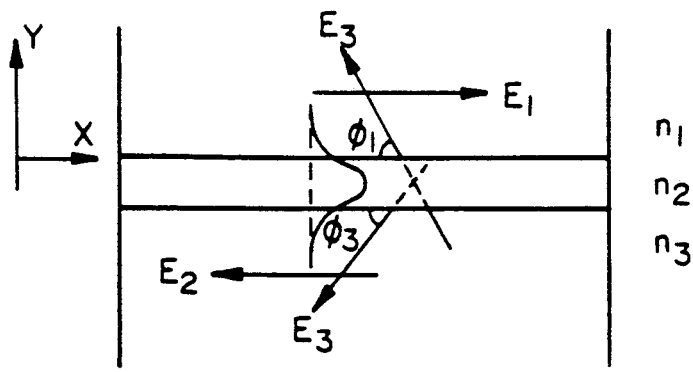
FIG. 1
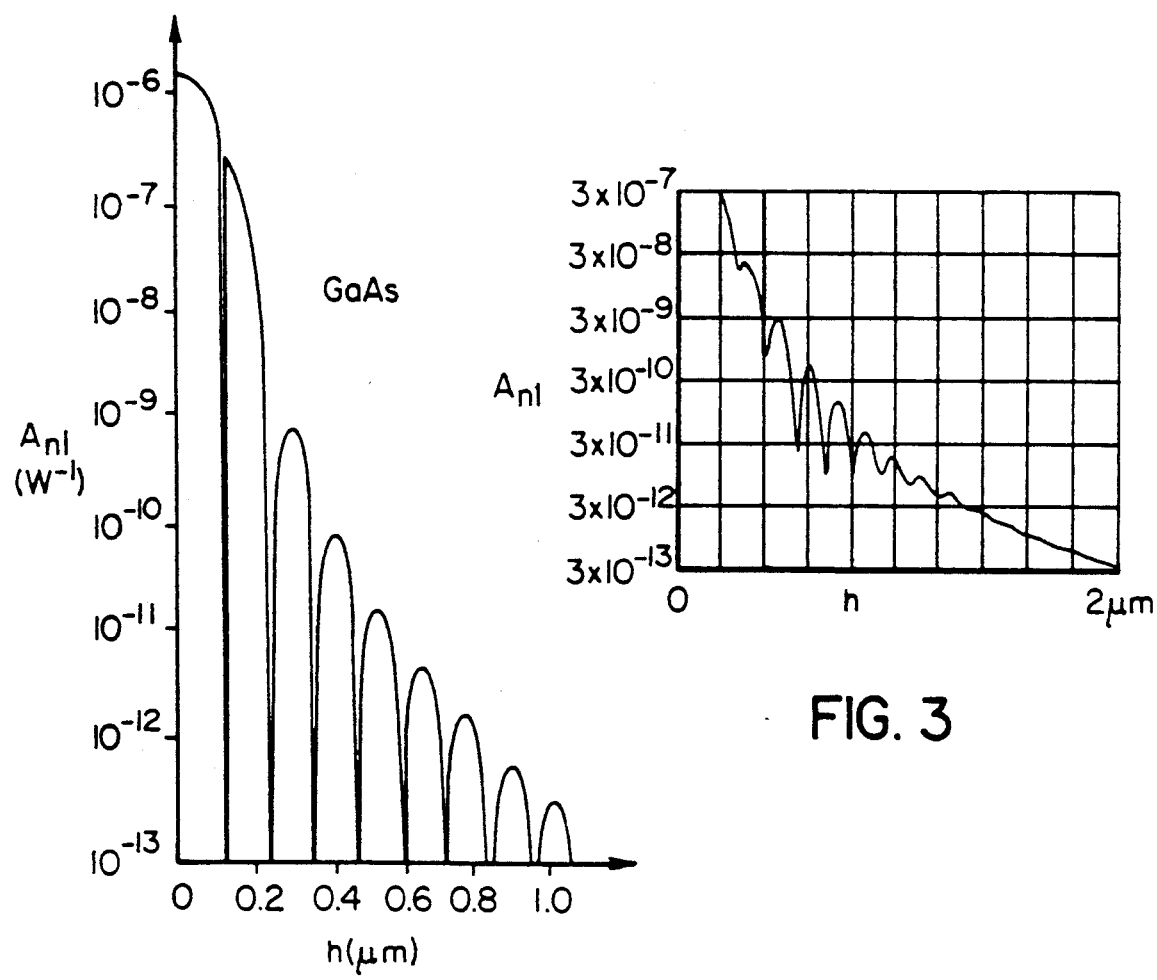
FIG. 2
FIG. 3

MULTILAYER SEMICONDUCTOR WAVEGUIDE DEVICE FOR SUM FREQUENCY GENERATION FROM CONTRA-PROPAGATING BEAMS

FIELD OF THE INVENTION

The present invention to semiconductor harmonic laser sources. More specifically, it is directed to coherent light sources in which coherent contra-propagating lights in a multilayered waveguide generates a coherent light at the sum frequency.

BACKGROUND OF THE INVENTION

In Optics Letters, Vol. 4, No. 2, February 1979, pp. 58-59, R. Normandin (the present inventor) et al, reported the nonlinear mixing of oppositely propagating guided waves. The resultant field was coupled to radiation modes and propagated in a direction perpendicular to the waveguide surface, in the case of equal frequency fundamentals. In subsequent articles, its application to picosecond signal processing, the creation of all optical transient digitizers and spectrometers demonstrated the potential usefulness of this work. (See Appl. Phys. Lett. 36 (4), Feb. 15, 1980, pp. 253-255 by R. Normandin et al; 40 (9), 1982, pp. 759-761 by R. Normandin et al, and "Integrated Optical Circuits and Components" edited by L. D. Hutcheson, Dekker Inc., New York, U.S.A., Chapter 9, by G. I. Stegeman et al.) The overlap of the two oppositely propagating fields will give rise to a nonlinear polarization source at the sum frequency. In bulk media such a process is nonradiative due to the simultaneous requirement of energy and momentum conservation in all directions. This is not the case in a waveguide geometry.

Unfortunately since the waves do not grow with distance (no phase matching) the resultant fields are much weaker than that obtained in a traditional second harmonic generation device. Therefore, this nonlinear interaction has remained largely a laboratory curiosity. However, the present inventor has succeeded to increase this interaction by factors of $10^7$ and obtain efficient conversion in the visible region. With presently available diode laser sources most of the visible spectrum can be reached. Ultrafast subpicosecond samplers and monolithic high resolution spectrometers are possible in the context of fiber optical communication systems and optoelectronic integrated circuitry. This invention is thus relevant to optical data storage, display technology, optical radar and ranging and wavelength division multiplexing optoelectronic communication systems, to name a few.

OBJECTS OF THE INVENTION

It is therefore an object of the present invention to provide a semiconductor coherent light source.

It is a further object of the present invention to provide a semiconductor coherent light source which includes active lasing means.

It is yet another object of the present invention to provide a semiconductor coherent light source which comprises a multilayer structure.

SUMMARY OF THE INVENTION

Briefly stated, a semiconductor coherent light source according to the present invention includes an optical waveguide for propagating a light in one dimension under a guiding condition. The waveguide has a plurality of layers of at least one optically non-linear semiconductor material, the plurality of layers being parallel to the dimension. The coherent light source further includes coherent light injection means for injecting into the waveguide along the dimension contra-propagating coherent lights of fundamental wavelengths to produce a secondary light at the sum frequency of the contra-propagating lights in a direction relative to the dimension and determined by the mutual relationship of the contra-propagating lights. The layers have the thickness and periodicity determined by the sum frequency and the refractive indices of the plurality of layers such that the secondary light produced therein is enhanced as it leaves the waveguide in the determined direction.

BRIEF DESCRIPTION OF THE DRAWINGS

For a more complete understanding of the present invention and for further objects and advantages thereof, references may be made to the following description taken in conjunction with the accompanying drawings in which:

FIG. 1 is a schematic cross-sectional view of a waveguide.

FIG. 2 is a graph showing the harmonic cross-section $A_{nl}$ for GaAs, according to theoretical calculations.

FIG. 3 is a graph showing $A_{nl}$ under more realistic conditions.

DETAILED DESCRIPTION OF THE PREFERRED EMBODIMENTS

Figure 6:
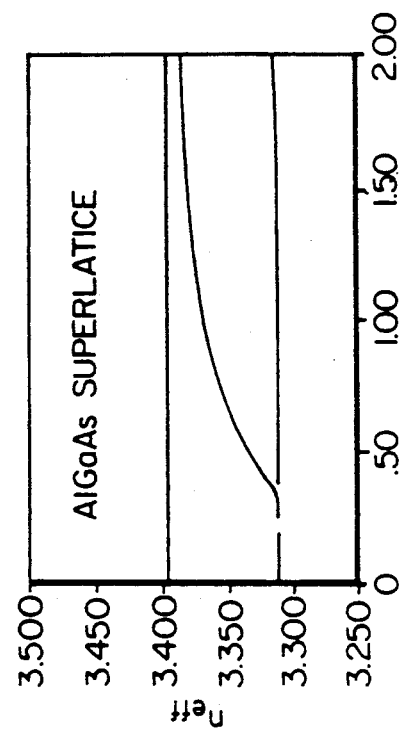
FIG. 6 is a graph showing the electric field distribution in the waveguide.

As described above, the aforementioned articles by the present inventor report that contra-propagating lights in a guided waveguide produce a second harmonic light in a direction perpendicular to the waveguide axis. The articles deal in detail with theoretical explanations. The generation of harmonic light can be expanded to cases where oppositely propagating lights of different wavelengths are coupled in a waveguide.

FIG. 1 is a cross-sectional view of a generalized waveguide which is formed by three layers having refractive indices $n_1$, $n_2$ and $n_3$ as shown. The layers are made of optically non-linear materials and satisfy the guiding conditions for the propagating lights. In the figure, $E_1$ and $E_2$ indicate the oppositely propagating lights and the resultant light $E_3$ is radiated in the directions $\phi_1$ and $\phi_3$ with respect to the axis of the waveguide. The field distributions of $E_1$ and $E_2$ are also shown.

The wavelength and the directions $\phi_1$ and $\phi_3$ of the resultant light is determined by the laws of conservation of energy and of momentum. Therefore, if $\vec{k}_1$, $\vec{k}_2$ and $\vec{k}_3$ are, respectively, wave vectors of the contra-propagating lights and the resultant light, and $\lambda_1$, $\lambda_2$ and $\lambda_3$ are, respectively, wavelengths of the lights under discussion, the following equations must be satisfied:

$$\vec{k}_1 + \vec{k}_2 = \vec{k}_3$$

$$1/\lambda_1 + 1/\lambda_2 = 1/\lambda_3$$

As reported in the articles, if $\lambda_1 = \lambda_2$, $\phi_1$ and $\phi_3$ are 90°. It should be noted here that in a certain case were waveguide forms a laser cavity between two mirrors, $E_1$ and $E_2$ are the same laser light travelling in opposite directions and having the same wavelength.

While it can be generalized by extrapolation as described above, the following discussion deals mainly with the case where the oppositely propagating lights have the same wavelength, e.g. $\lambda_1 = \lambda_2$. It is now convenient to describe the second harmonic generation in the normalized form as $$I^{2\omega} = A_{nl} I_1 I_2$$

where $I^{2\omega}$, $I_1$ and $I_2$ are the intensities of the second harmonic light and contra-propagating lights respectively, and $A_{nl}$ is the harmonic cross-section. $A_{nl}$ for uniform GaAs optical waveguides was calculated and published in Appl. Phys. Letters 38(10), 1981, pp 759–760, P. J. Vella et al. Other optically nonlinear materials, e.g. AlGaAs, AlAs, InGaAs and InP, can be considered for this purpose under different guiding conditions.

As an example, and neglecting materials losses, the cross section $A_{nl}$ for a thin, symmetric GaAs layer is shown in FIG. 2. This calculation was for 1.06 μm as the fundamental and was performed several years ago. Such a symmetric layer has no guiding cutoff and a strong interference by interfaces between layers is evident. For a fixed input intensity the guided fundamental field decreases with increasing guide thickness (horizontal axis) resulting in a sharp reduction in radiated harmonic. This is clearly seen as the envelope of FIG. 2 and at about 1.0 μm, the cross-section is $\approx 10^{-13} W^{-1}$ which is very small.

A more accurate model is presented in FIG. 3. Using the geometry depicted in FIG. 1, for air as the top medium, with fully complex indices of refraction (i.e. with full material losses taken in consideration) the harmonic cross-section is presented. Cutoff for guiding at the fundamental (1.06 μm again) is around 0.2 μm where data are absent. The interference effects are still present despite being attenuated by absorption losses. Unfortunately, the cross-section decreases sharply for thicker, more usable films. With such a high index of refraction it is difficult to couple light efficiently to very thin films. In a fiber optic context it is nearly impossible to get usable amounts of light coupled in.

In order to get usable devices the harmonic cross-section must be improved and its decrease with thickness controlled.

It is possible to eliminate the interference effects by simply creating a multilayer of nonlinear/linear/nonlinear/linear etc. materials. With the proper spacing all the contributions would arrive in phase at the top interface. This is shown schematically in FIG. 4. In the figure, a multilayer waveguide 10 is formed on a buffer 12 of AlGaAs, which is in then provided on a GaAs substrate 14. A pair of fiber optics 16 and 18 are also schematically shown. An arrow 20 depicts the radiated harmonic light. In fact, the harmonic light is also radiated in the opposite direction but is absorbed in the buffer and substrate. It can be recuperated and redirected by a mirror structure built at the interface.

Figure 5:
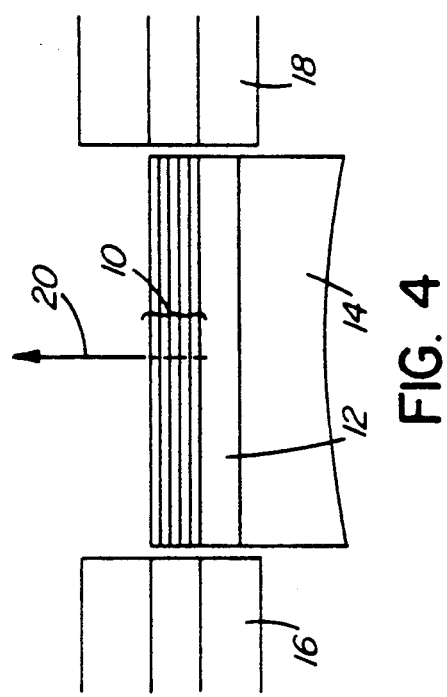
FIG. 5 shows, in graphs, improvements in the harmonic cross-section $A_{nl}$, according to one calculation.

The layer periodicity is taken as the radiated wavelength in the guide, of course. The periodicity $\Delta$ is determined by $\Delta = \lambda_3/n_2$ where $\lambda_3$ is the wavelength of the secondary light and $n_2$ is the refractive index of the layer at $\lambda_3$. In the present instance, the periodicity between the crystalline (to be nonlinear) and isotropic media is of the order of 1200 Å and therefore the thickness of each layer is in the neighborhood of 600 Å. The overall cross-section is shown in FIG. 5 as the higher curve. This is compared with the normal, homogeneous GaAs guide at the bottom. Noting this is a logarithmic scale enormous increases are obtained. Note also the reduced falloff as layer thickness is increased.

There is an unfortunate fact: such an alternating stack of linear vs. nonlinear layers would be difficult to build in reality. Since epitaxial techniques are used to grow such semiconductor films the crystalline space groups are identical between layers. Therefore, each layer would have a similar second harmonic coefficient. It is possible to devise solutions to this problem, near the bandgap in particular, but the overall performance does not justify the added complications.

Figure 7:
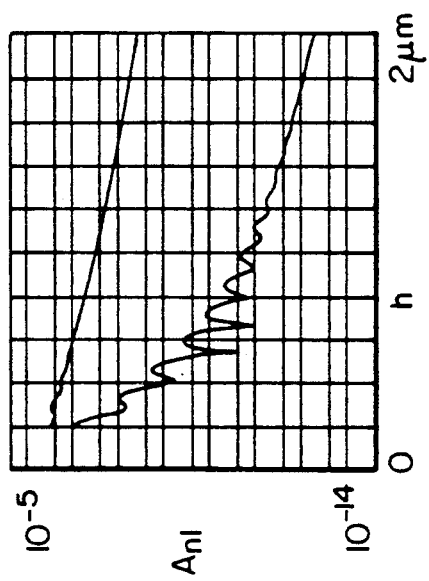
FIG. 7 is a dispersion curve of the waveguide.

The object is to have all nonlinear field contributions add in phase in the far field. Instead of modulating the nonlinear coefficient a second approach and one of the preferred embodiments of this invention is to simply modulate the phase of the radiating nonlinear field by creating regions of differing index of refraction. Thus, assuming similar nonlinear coefficients for GaAs and AlGaAs, a cross-section calculation was performed. The result of alternating GaAs and AlGaAs layers in a waveguide is shown in FIG. 6, for a guided wavelength of 1.06 μm. The buffer layer is also made of AlGaAs. In all cases the Al content was set at 40%. On the horizontal axis, air, multilayer waveguide (ML), AlGaAs buffer and GaAs substrate are indicated. The guided $TE_0$ electric field (E field) for a 0.6 μm film is shown on the vertical axis. The dispersion curve is shown in FIG. 7 as a function of the guide thickness up to 2 μm.

Figure 8:
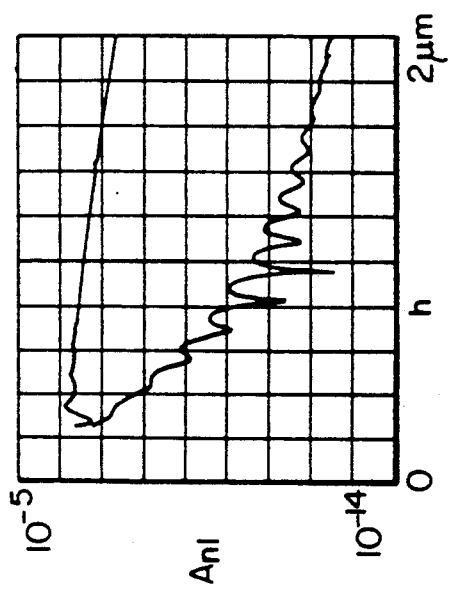
FIG. 8 shows, in graphs, improvements in the harmonic cross-section $A_{nl}$ according to a further embodiment.

The resultant enhancement is shown in FIG. 8. Note the uniform cross-section vs. thickness. In some regions an enhancement of up to one million is obtained. Clearly the amplification or resonance effect of the multilayer overtakes both the absorption losses of the GaAs at 0.53 μm and the reduction in field intensity as the waveguide thickness is increased.

Figure 9B:
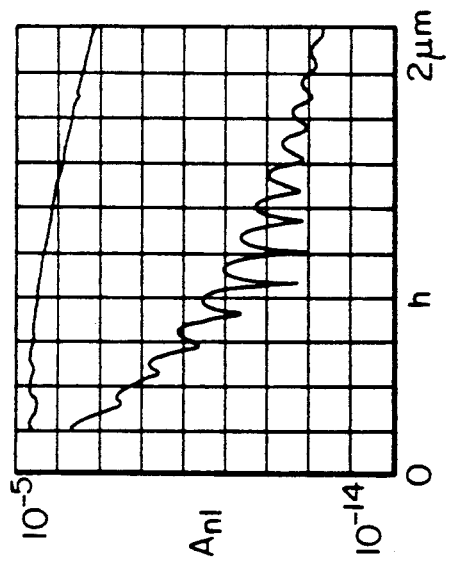
FIGS. 9b and 9c are cross-section curves and graphs indicating improvements in the harmonic cross-section $A_{nl}$ according to a further embodiment.
Figure 9C:
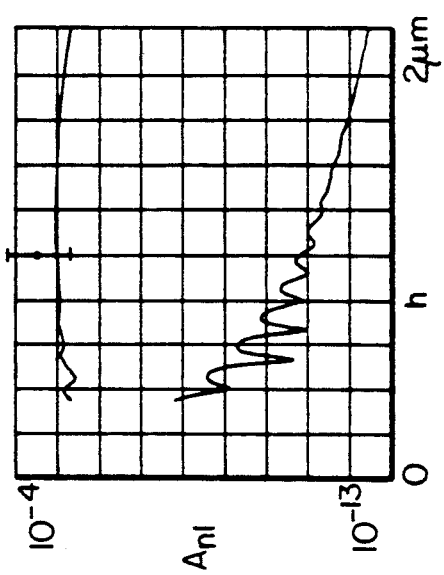
Figure 9A:
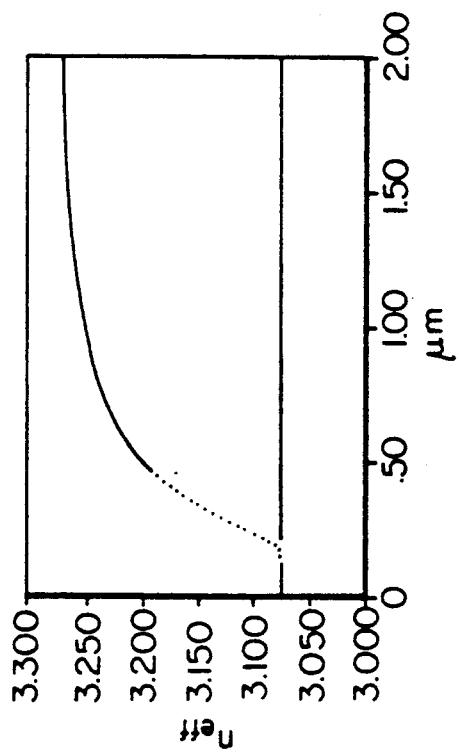
FIG. 9a is a typical dispersion curve for a multilayer waveguide.

A further increase by a factor of ten is possible by increasing the aluminum content of the alloy to 80%. The complex index of refraction imaginary part is then reduced to 0.002 at 0.53 μm greatly reducing optical absorption losses. Furthermore, the increase in index change between the GaAs and AlGaAs allows for more efficient phase control. The result is shown in FIGS. 9a, and 9b. The dispersion curve of the multilayer waveguide at 1.06 μm is shown in FIG. 9a. In FIG. 9b, the upper curve is the effective cross-section for the layered film. Enhancements by factors over one million are quite evident for thick micron sized layers. As a further example, in FIG. 9c, the case of $Al_{0.9}Ga_{0.1}As$ with $Al_{0.7}Ga_{0.3}As$ is computed and compared to a single GaAs film. Enhancement of over ten million fold in cross section can be realized.

Figure 4:
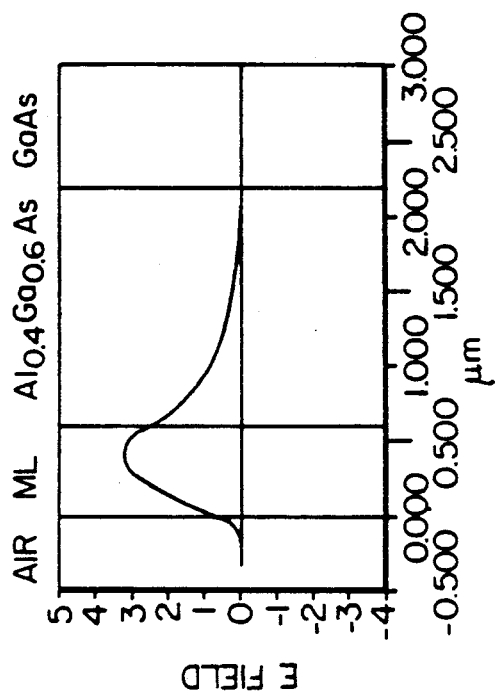
FIG. 4 is a schematic cross-sectional view of a coherent light source according to one embodiment of the invention.

Subsequently, experiments were conducted using the geometry shown in FIG. 4. A normal 0.6 μm thick GaAs waveguide on a 1.6 μm thick AlGaAs buffer was compared to a multilayer stack of AlGaAs/GaAs layer with a resultant thickness of 0.6 μm, again on a buffer layer AlGaAs, 1.6 μm thick. Thus both waveguide geometries are identical, apart from the multilayer.

Figure 10A:
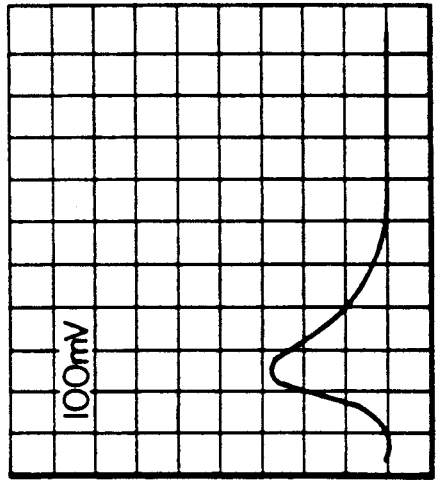
Figure 10B:
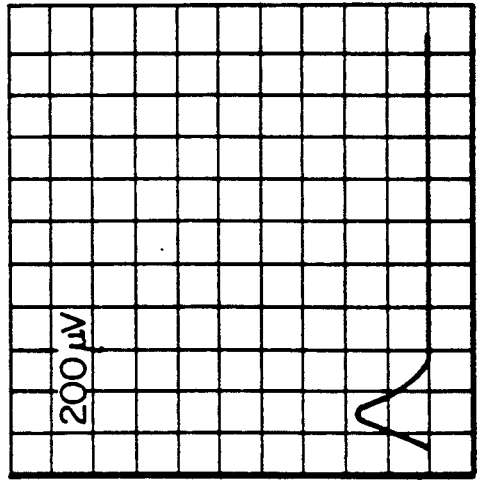

The first sample was grown with a 40% aluminum content. FIGS. 10a and 10b show respectively the harmonic outputs of the multilayer and the single layer configurations. As can be seen in figures, an 800-fold enhancement in 0.53 μm light emission was obtained. Comparing with theory, shown in FIG. 8, for 0.6 μm thickness an enhancement of approximately 800 was predicted. The mode beating in the harmonic signal was clearly visible when imaging the harmonic, green surface emission. Because of the orientation of the (100) substrate, a mixture of TE and TM must propagate in order to have any harmonic signal generated. Substrates with a (111) orientation have been ordered to solve this problem. The mode beating gave rise to a surface array of sources spaced a few hundred of micrometers apart. As this coherent array radiated, several sharp sidelobes could readily be seen by eye.

Figure 11A:
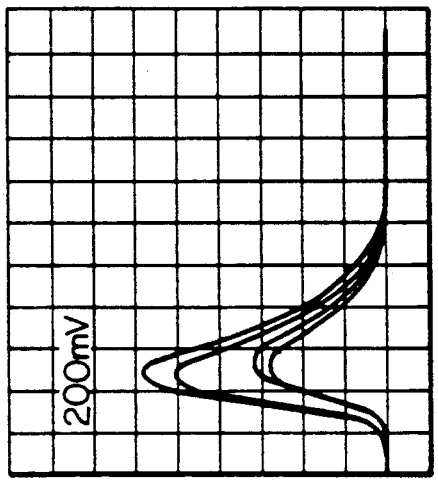
FIGS. 10a, 10b and 11a, 11b are actual results obtained in experiments.
Figure 11B:
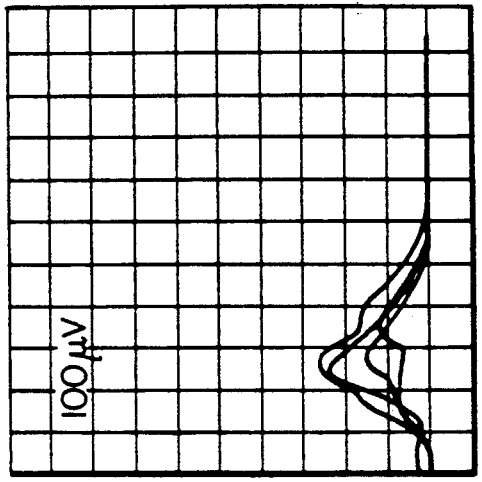

The next sample was grown with the geometry except for an aluminum content of 80% in the layers. Signal strengths of the multilayer guide and the simple GaAs layer guide are shown in FIGS. 11a and 11b respectively. An increase of approximately 3000 is apparent. The enhancement is most likely greater since the photomultiplier detector was in saturation with the multilayer and near its signal-to-noise limit for the normal layer. The theoretical model predicted an enhancement of over 4000 in this case. This is shown in FIG. 9b for a 0.6 μm waveguide. In another experiment, a 1 μm thick $Al_{0.9}Ga_{0.1}As/Al_{0.7}Ga_{0.3}As$ multilayer structure was also built. An absolute cross section measurement is shown in FIG. 9c. Agreement with theory is excellent as shown by the actual measurement indicated in the figure.

In all cases the average power coupled in the waveguide was less than 70 μW with a repetition rate of 7.7 kHz and pulse widths of 200 ns. The 1.06 μm light source was an unpolarized CVI Nd-YAG laser. In fact, for the 80% Al sample the green radiation field was still visible with the laser running CW at the same average power level. In a true laser cavity the circulating power is, of course, several orders of magnitude more intense. In a channel laser geometry there is further confinement, in the plane of the guide, thus increasing the power density by another order of magnitude.

The electromagnetic field propagating in a laser cavity consisting of a waveguide for light confinement (typical of geometries used in semiconductor diode lasers) can be thought of as two contra-propagating fields of the identical wavelength. This leads to further embodiments of the present invention.

Figure 12:
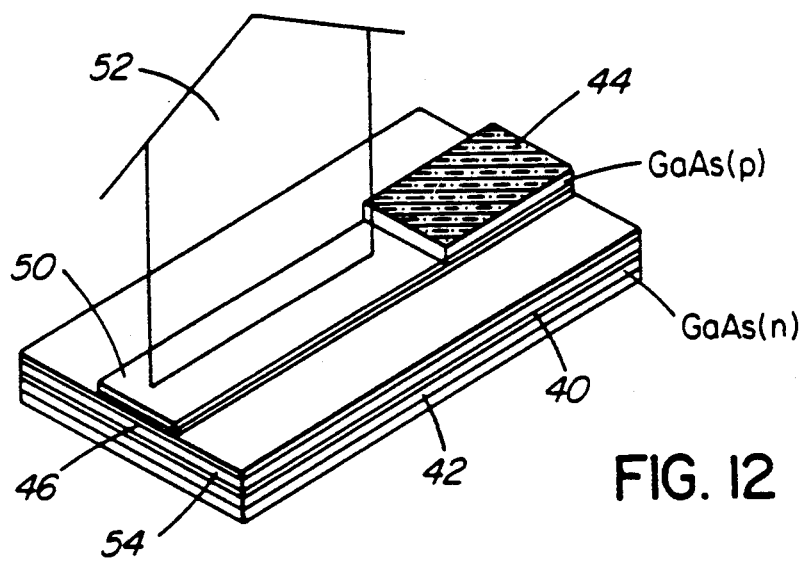
FIGS. 12 and 13 are schematic perspective views of the semiconductor laser sources according to still further embodiments of the invention.

Referring to FIG. 12, a further embodiment is schematically illustrated, using electrically pumped geometries. A harmonic laser source of this embodiment includes an active region 40 and radiating region 42 whose composition is the same everywhere except for additional layers 44 needed to form p-n junctions in the active region for lasing. The laser mirrors 46 and 48 are the front and back of the chip. By providing 100% mirrors for the fundamental wavelength the overall lasing threshold can be substantially lower than that of a conventional laser. The radiating region is the thinned down region of exposed multilayer 50. The harmonic light 52 is a planar beam emitted perpendicularly to the multilayer structure of the radiating region. There is no incompatibility between the lasing layers and the harmonic generation regions. Thus it is possible to have a quantum well recombination layer (e.g. as shown by the thin region 54 in the figure) for lasing efficiency without disturbing the harmonic generation. Similarly it is also possible to have an etch stop layer in the laser structure without affecting its performance. This etch stop layer is then used to provide a controlled etch down to the multilayer radiative region. Transparent electrodes can be used also.

By using conservative estimates of the ridge width, length and the intracavity lasing power density of an InGaAs for example a radiated field of better than 0.1 mW CW is obtained for green operation. The full visible spectrum can be reached by using InP (red), InGaAs (yellow, green) or GaAs (blue).

Figure 13:
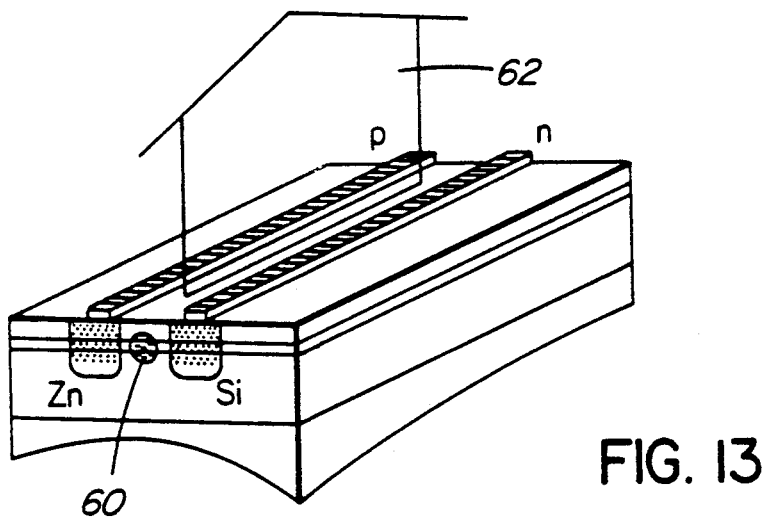

FIG. 13 shows yet another pumped geometry. It has the advantage of being side pumped. Therefore the full length is available for harmonic radiation, maximizing device efficiency. Zinc and silicon are implanted or diffused to create the needed p and n contact region and provide a change in refractive index for the quantum well region, thus providing optical lateral confinement. The laser mirrors are on the front and back surfaces of the chip and form a laser cavity 60 between them. The harmonic light 62 is emitted perpendicularly with the full length of the laser cavity.

Figure 14:
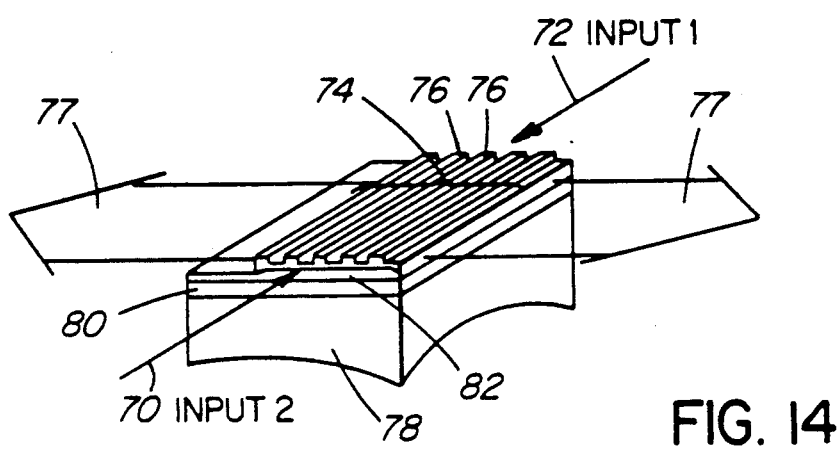
FIG. 14 is a schematic view of a further embodiment which employs a side-emitting geometry.

FIG. 14 is a schematic view of a further embodiment which solves the difficult of growing a waveguide with a stack of alternating linear and nonlinear materials or with multilayers of different refractive indices. The geometry shown in the figure permits the construction of optimized structures with a single material,, thus eliminating materials constraints. The fundamental, waveguided light 70 and 72, either from outside inputs or from the monolithically integrated laser action, propagates in a corrugated single mode channel waveguide 74. For guided harmonic light the effective refractive index of the structure will be given by the dispersion relation for its proper material constants and guide thickness. Therefore the addition of small ribs 76 in the longitudinal direction will locally modify the effective propagation refractive index for the harmonic light 77, without perturbation of the guided fundamentals in the plane perpendicular direction. The substrate 78 carries a buffer layer 80. The increased height of a sub-guide 82 under the ribs will change the effective guided index for the harmonic light. This is the same effect achieved in the stack geometry by the variation in film composition. Without composition restrictions, in this geometry, extremely large changes in effective index are possible simply by controlling the height of the corrugated structure. While in this embodiment, small ribs are formed by removing material away, it is also possible to create the same effect of local refractive index modification by doping desired areas e.g. by focused ion beam technique. Its periodicity is subject to the same conditions for the harmonic wavelength as in our previous calculation. This therefore implies a resonance of approximately 65 nm.

Figure 15:
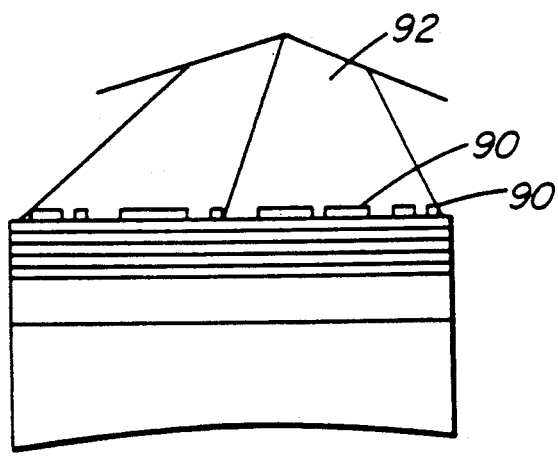
FIGS. 15 and 16 illustrate yet other embodiments of the invention in which holograms are used for phase control.
Figure 16:
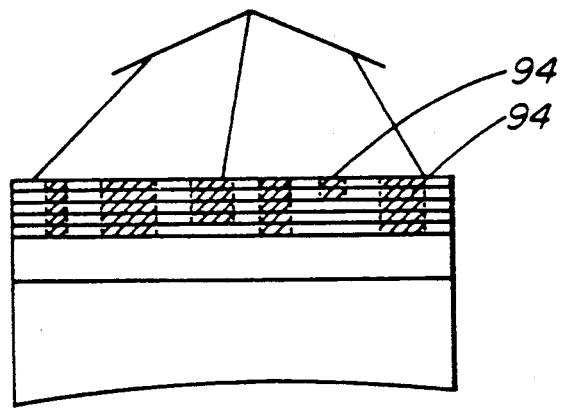

FIGS. 15 and 16 illustrate further embodiments of the invention which make use of holography. By using a spatially controlled phasing a plane wave can be transformed in any desired far field pattern. It is therefore possible to synthesize the effect of various optical components such as lenses, prisms or gratings by holographic techniques. As can be reasoned from the foregoing description, the added layers control the phase of the harmonic light by the alternating variation of the layer' index of refraction. Similarly, the addition of an overcoat can be used to modify the emitted plane wave. This can be accomplished in two ways, first, by a simple film on top; second, by a gradual change through the layers. Therefore, FIG. 15 shows a hologram overlayer 90 on the buffer and substrate to control the phase of the radiated harmonic light 92. FIG. 16, on the other hand, indicates implanted hologram 94. Both effects can easily be obtained by focused ion beam (FIB) processing. After proper computing of the holographic pattern for the desired optical effect a FIB written photoresist is used to pattern and etch the surface. In the second case FIB implantation will cause damage to the multilayer at the desired locations. Selective etching can be used to remove these areas. Similarly the damaged regions can be left as is, the induced change index due to the implantation and the structural damage being sufficient to provide the needed lateral phase control for the holographic reconstruction.

Figure 17:
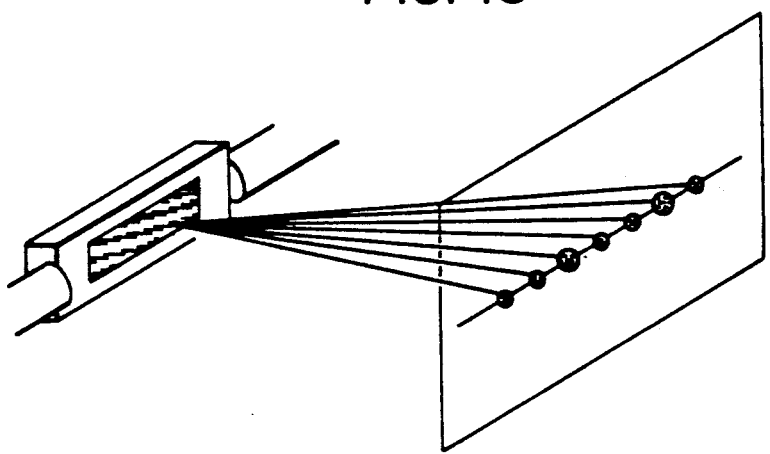
FIG. 17 is a perspective view of an embodiment in which a hologram is used for functions of discrete optical components.

Thus this FIB technique can be used to write on the surface of the harmonic multilayer waveguide a synthesized holographic pattern. This holographic pattern provides the needed diffraction effect to replace discrete optical components that would otherwise be needed to process the harmonic field. An example of a lens/grating combination is shown in FIG. 17.

We claim:

1. A semiconductor coherent light source, comprising:
   an optical waveguide means for propagating a light in one dimension under a guiding condition,
   coherent light injection means for injecting into the said waveguide means along said dimension contra-propagating coherent lights of fundamental wavelengths,
   the said waveguide means having a multilayer means for producing and enhancing a secondary light at the sum frequency of said contra-propagating lights in a direction different from the said dimension and determined by the mutual relationship of said contra-propagating lights,
   said multilayer means comprising a plurality of layers of at lest one optically non-linear semiconductor material, said plurality of layers being parallel to the said dimension and having a predetermined thickness and periodicity determined by the refractive indices of said layers and by the sum frequency such that the said secondary light produced in the said multilayer means is enhanced as it leaves said waveguide means in said direction.

2. The semiconductor coherent light source according to claim 1 wherein:
   all the said layers have a substantially same thickness and alternate layers have a first and a second predetermined refractive index.

3. The semiconductor coherent light source according to claim 1 wherein:
   the said contra-propagating lights are of a same fundamental wavelength, and
   the said secondary light is the second harmonic and is produced in a direction perpendicular to the said layers.

4. The semiconductor coherent light source according to claim 2 wherein:
   the said contra-propagating lights are of a same fundamental wavelength and the said secondary light is the second harmonic and is produced in a direction perpendicular to the said layers.

5. The semiconductor coherent light source according to claim 3 wherein:
   the said waveguide further comprises a lasing cavity and a laser active means for producing and injecting into the said waveguide along the said contra-propagating lights of the same fundamental wavelength.

6. The semiconductor coherent light source according to claim 4 wherein:
   the said waveguide further comprises a lasing cavity and a laser active means for producing and injecting into the said waveguide along the said contra-propagating lights of the same fundamental wavelength.

7. The semiconductor coherent light source according to claim 3 wherein:
   the said coherent light injection means is a fiber optic connected to one end of the said waveguide; and
   a mirror is provided on the other end of the said waveguide.

8. The semiconductor coherent light source according to claim 4 wherein:
   the said coherent light injection means is a fiber optic connected to one end of the said waveguide, and
   a mirror is provided on the other end of the said waveguide.

9. The semiconductor coherent light source according to claim 3 wherein:
   the said coherent light injection means is fiber optics connected to both ends of the said waveguide.

10. The semiconductor coherent light source according to claim 4 wherein:
    the said coherent light injection means is fiber optics connected to both ends of the said waveguide.

11. The semiconductor coherent light source according to claim 1 wherein:
    a holographic layer provided on the outermost layer of the 12. The semiconductor coherent light source according to claim 2 further comprising:
    a holographic layer provided on the outermost layer of the waveguide.

13. The semiconductor coherent light source according to claim 1 wherein:
    each of the said layers has a predetermined thickness and a predetermined spatial areas having different refractive indices to form an implanted holographic optics.

14. The semiconductor coherent light source according to claim 2 wherein:

each of the said layers has a predetermined thickness and a predetermined spatial areas having different refractive indices to form an implanted holographic optics.

15. The semiconductor coherent light source according to claim 2 wherein:
the said coherent light injection means is fiber optics connected to both ends of the said waveguide.

16. The semiconductor coherent light source according to claim 2 wherein:
the said coherent light injection means is fiber optics connected to both ends of the said waveguide.

17. The semiconductor coherent light source according to claim 2 wherein:
each of the said layers is arranged one beside the other on a substrate and has a predetermined width and refractive index.

18. The semiconductor coherent light source according to claim 2 wherein:
each of the said layers is arranged one beside the other on a substrate and has a predetermined width and refractive index.

19. The semiconductor coherent light source according to claim 4 wherein:
each of the said layers is arranged one beside the other on a substrate and has a predetermined width and refractive index.

20. The semiconductor coherent light source according to claim 6 wherein:
each of the said layers is arranged one beside the other on a substrate and has a predetermined width and refractive index.

* * * * *